United States Patent [19]

Schröder

[11] 4,270,103
[45] May 26, 1981

[54] AMPLIFIER HAVING A VARIABLE PROPAGATION CONSTANT

[76] Inventor: Ernst Schröder, Pinkenburger Strasse 25D, D-3000 Hannover 51, Fed. Rep. of Germany

[21] Appl. No.: 23,006

[22] Filed: Mar. 22, 1979

[30] Foreign Application Priority Data

Mar. 22, 1978 [DE] Fed. Rep. of Germany ....... 2812431

[51] Int. Cl.³ .................... H03H 11/12; H04B 1/64
[52] U.S. Cl. ............................... 333/14; 330/86
[58] Field of Search .................. 333/14; 330/86, 279, 330/282

[56] References Cited

U.S. PATENT DOCUMENTS

| 3,815,039 | 6/1974 | Fujisawa et al. | 330/86 X |
| 3,969,680 | 7/1976 | Wermuth | 333/14 X |
| 4,119,922 | 10/1978 | Schroder | 333/14 X |

FOREIGN PATENT DOCUMENTS 2707609  8/1978  Fed. Rep. of Germany ........... 330/282

*Primary Examiner*—Paul L. Gensler
*Attorney, Agent, or Firm*—Spencer & Kaye

[57] ABSTRACT

A compander system wherein, for compatibility with systems of constant amplification, dynamic compression and expansion are effected only within a limited level range.

5 Claims, 3 Drawing Figures

AMPLIFIER HAVING A VARIABLE PROPAGATION CONSTANT

BACKGROUND OF THE INVENTION

It is known to improve the quality of reproduction of audio frequency performances by increasing the signal-noise spacing by a compression-expansion system (so-called compander system). The useful signals are compressed in amplitude before the disturbed transmission path e.g. line or sound tape, and are expanded after transmission. In the case of companders for professional use an endeavour is made to obtain a fully constant slope of the compander and expander characteristics over as wide a range of regulation as possible. The advantage of such characteristics is that the input level of the expander may deviate from the output level of the compressor without the dynamic variation of the reproduced signal differing from the dynamic variation of the original signal.

This wide range of regulation desired for professional use cannot however be combined, with the compatibility required for consumer use, with transmission devices of constant amplification. The reproduction of such a compressed signal without expander has a poor sound since e.g. interference in pauses of the input signal is greatly increased. Likewise unsatisfactory is the audio impression with an uncompressed signal which is reproduced via an expander having an above-mentioned regulating characteristic. In this case a very much exaggerated dynamic of the reproduction occurs.

SUMMARY OF THE INVENTION

The problem underlying the invention therefore consists in providing an amplifier which in use in a compander permits compatibility with the dynamic range between the weakest and strongest signals of linearly operating systems and in which the independence of compressor output signal and expander input signal is retained to a great extent.

According to the invention a circuit arrangement for compressing or expanding the dynamic range of an audio frequency signal comprises: a first signal path including control means for varying the transmission of the path to the said signal; a second signal path branched from the input or output of the first path and including further control means for varying the transmission of the path to the said signal; each control means including an amplifier provided with a negative feedback path having a variable resistance device and resistors arranged to provide a predetermined limit to the range of variation of resistance of the feedback path; a control voltage generator means arranged in the second path and connected to the said devices to derive from the said signal, and apply to the said devices, a control voltage to vary the resistance of both feedback paths; and limiting means associated with the control voltage generator means to provide a predetermined limit to the range of variation of the control voltage.

BRIEF DESCRIPTION OF THE DRAWINGS

The invention will be explained in more detail with reference to a level diagram and a practical example which is illustrated in the drawing.

DESCRIPTION OF THE PREFERRED EMBODIMENTS

Figure 1:
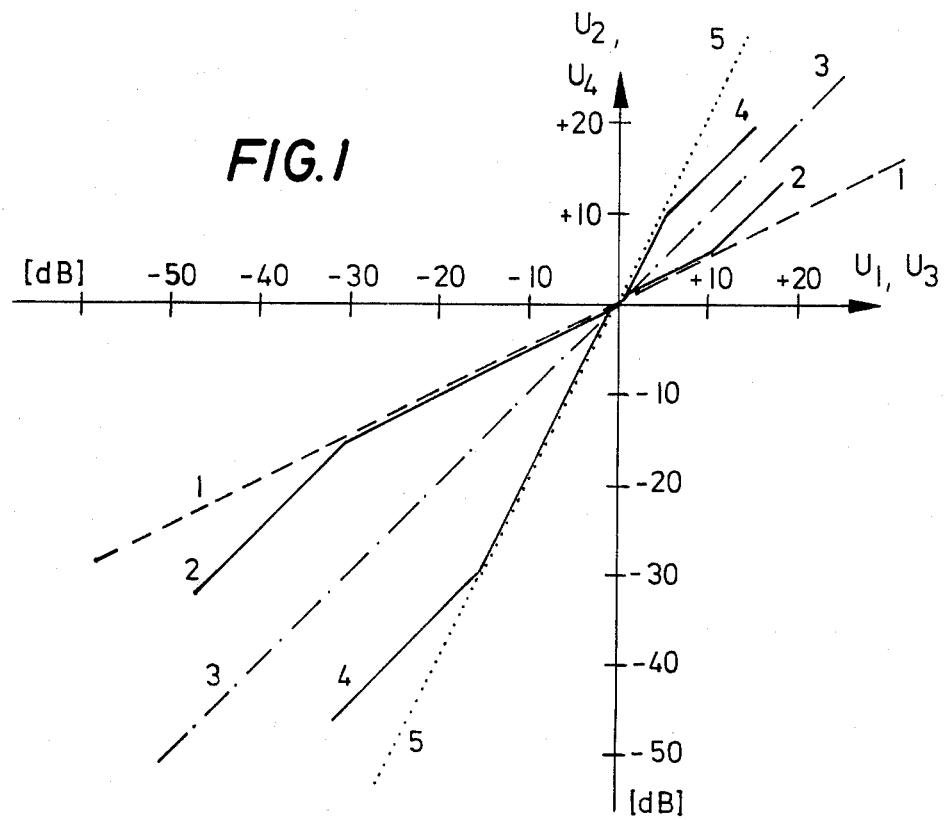
FIG. 1 shows a level diagram in the usual form.

In FIG. 1 there is reproduced a level diagram in the usual form. The input signals $U_1$, to be processed, of a compression circuit lie on the abscissa and increase in absolute value from left to right. The output signals $U_2$ of the compression circuit lie on the ordinate and increase upwardly. The broken straight line 1 gives the relationship between the compressor output signal $U_2$ and the compressor input signal $U_1$. In the ideal case this characteristic extends as a straight line of infinite extent through the first and third quadrants and through the zero point of the diagram illustrated. With an assumed degree of compression of 2:1 the slope of the compression characteristic is 1:2.

The input signals $U_3$ of an expansion circuit complementary to the compression circuit likewise lie, in the level diagram illustrated, on the abscissa and rise from left to right. The output signals $U_4$ lie on the ordinate and rise upwardly. The relationship of the expander output signals to the expander input signals is shown by the dotted line characteristic 5. In the ideal case this characteristic also extends as a straight line of infinite extent through the first and third quadrants as well as through the zero point of the diagram illustrated. Its slope is accordingly 2:1 corresponding to a degree of expansion of 1:2.

By superimposing the characteristics 1 and 5, that is, multiplying their slopes, there is obtained a characteristic 3 which is illustrated in the drawing as a straight chain line with a slope of 1:1. The practical design of an amplifier operated as a compressor or an expander in accordance with the characteristics 1 and 5 would mean that its propagation constant must be adjustable to values between zero and infinity. This requirement is not practicable; and endeavour is made, however, so to establish the limits of the range of variation of the propagation constant that the characteristic is linear within the working range used. The range of level above the amplifier's own noise and below the exaggeration limit is to be regarded as the operating range. That is, the operating range is above the noise level and below the point on the control characteristic above which the signal distorts as the result of limiting.

In order to achieve, in accordance with the problem underlying the invention, compatibility with linearly operating systems the amplifier—departing from this principle—is so designed that its propagation constant is variable only between a first and a second input level. By first and second input level is understood that in a predetermined mode of operation these levels have a fixed value. It may of course be possible to provide a plurality of modes of operation in which the levels can be selectively determined.

In a practical form of the invention, for the compander input signal the first (low) level is −30 dB and the second (high) level is +10 dB. Between these two levels the compression characteristic of the practical form according to the invention therefore coincides with the above-described, ideal characteristic 1. Below the first level and above the second level the characteristic changes direction in such manner that the corresponding parts of the characteristic proceed with a slope of 1:1. This means that below the first level and above the second level the amplifier has a constant amplification, the amplifying factor in the case of the first level having a different level from that in the case of the second level.

The expander characteristic is designed to be complementary to the compression characteristic. The first level is with an expander input signal of −15 dB, the second level is with an expander input signal of +5 dB. Below the first level and above the second level the expander characteristic 4 also proceeds with a slope of 1:1, i.e. the amplification factor of the expander circuit is in this range independent of the input level; the amplification factor associated with the first and second levels are therefore different.

Superimposition of the compressor and expander characteristics leads to a resultant characteristic that corresponds to the straight chain line 3 of slope 1:1. The dynamic variation of a useful signal processed by the compressor and the expander therefore corresponds to the dynamic variation of the original signal.

The limitation of the range of level in which the signals are compressed or expanded has the effect that very weak signals are excluded from compression or expansion. The compander therefore processes these signals exactly like a linear amplifier of constant amplification. Also, signals of particularly high amplitude are processed by the compander in the same manner as in the case of a linear amplifier of constant amplification. This processing of the useful signals permits compatibility of the systems with linearly operating amplifiers.

In the reproduction of signals which have been processed by the compressor but which have not been expanded, the interference level in the input signal is not significantly increased because weak signals, e.g. noise, generated by an input amplifier, are increased only 15 dB by the compression effect in accordance with characteristic 2 and not substantially in accordance with characteristic 1. Also the reproduction of uncompressed signals via the expander does not lead to the exaggerated dynamic impression mentioned above; signals of high amplitude are not further increased and signals of low amplitude are not further reduced. That is, the listener does not receive the impression that the played back signal has an excessive dynamic range extending from the smallest possible levels of the useful signal to the highest levels. The ranges of level that are critical for compatible treatment are therefore linearly processed.

Owing to the constant degree of compression or expansion between the first and second level—illustrated by the linear parts of the characteristics between the first and second level—even with differences of level between the compressor output signal and the expander input signal the original dynamic variation is retained. Only at the junctions of the characteristics ½ and 4/5 with low and high levels can there be dynamic distortions—with differences of level between the compressor output signal and the expander input level.

The circuit is therefore advantageously so designed that the range below the first level and above the second level in the case of the audio program provided is seldom controlled. Moreover, an audio impression shows that dynamic distortions in these ranges are not received so distorted as in the middle ranges. The said dependence of level, mentioned in connection with the ideal compander, between the compressor output and the expander input signal is therefore retained to a large extent with the invention.

Figure 2:
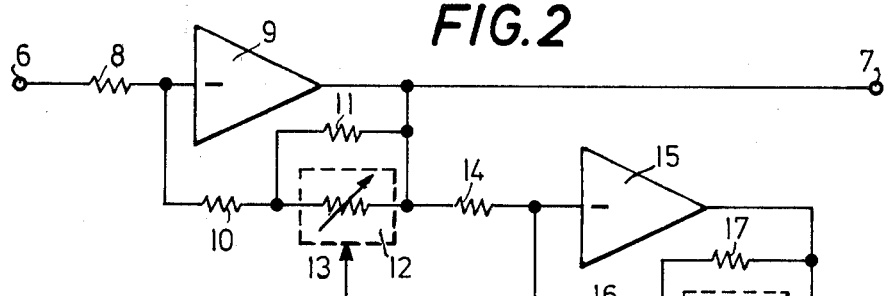
FIG. 2 shows a dynamic compressor according to the invention.

In FIG. 2 is illustrated a practical example of the invention. The circuit shows a dynamic compressor with a degree of compression of 2:1. It includes two similar amplifiers 9 and 15 connected in chain with electronically controllable resistors 12 and 18 in the feedback paths for varying the propagation constant. Each electronically controllable resistor 12, 18 has a control input 13, 19 which is connected to the output of a control voltage generator 21. The input of the control voltage generator 21, which as shown symbolically in FIG. 2 converts a dc signal to a corresponding ac signal, is connected to the output of the second chain amplifier 15. The useful signal is fed to an input terminal 6 which is connected via a resistor 8 to the input of the first chain amplifier 9. The compressed useful signal can be taken off at an output terminal 7 which is connected to the output of the first chain amplifier 9. The output of the first chain amplifier 9 is connected via a resistor 14 to the input of the second chain amplifier 15.

In accordance with the invention there is arranged between the control inputs 13, 19 of the electronically controllable resistors 12, 18 and the output of the control voltage generator 21 a limiting member 20 by which the lower and upper limits of the range of variation of the control voltage are determined. This limiting member may also be integrated in the control voltage generator 21, or the control voltage generator 21 may itself be so designed that it serves as a limiter.

Beyond these steps, in the circuit arrangement illustrated there is connected to each electronically controllable resistor 12, 18 a parallel impedance 11, 17 and a series impedance 10, 16. Thereby the adjustment of the range of the impedances arranged in the feedback path of the chain amplifiers is as a whole narrowed.

Figure 3:
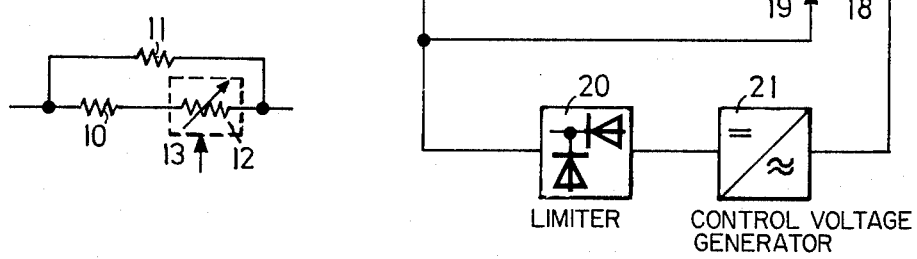
FIG. 3 shows a different form of a circuit detail of the dynamic compressor shown in FIG. 2.

Another variant is shown in the part drawing in FIG. 3 of the circuit elements 12, 11, 10. Here the series impedance 10 is connected in series with the electronically controllable resistor 12 and the parallel impedance 11 is arranged in parallel with the series circuit.

A similar circuit may also be provided wherein the electronically controllable resistor is arranged not in the feedback path but in the signal path or between the signal path and a reference voltage. The difference is always that the range of adjustment of the electronically controllable resistor 12, 18 is narrowed. There is also suitable an electronically controllable resistor which from its design has an upper and/or lower limiting value of resistance.

It is also possible, in an amplifier according to the invention, to provide only one controllable resistor of limited range of adjustment or only one limiter of the control voltage. Further, it is possible to determine the one limit for the variation of the propagation constant by an electronically controllable resistor of limited adjustment range and the other limit by a limiter of the control voltage.

The upper limit of the range of variation of the propagation constant can also be determined by providing, instead of the chain of amplifiers illustrated in FIG. 2 in an inverted connection, a chain of amplifiers in a non-inverted connection.

Furthermore, for a compander system in which the dynamic range is not reduced by the control voltage generator to the static value of 0 dB there is also the possibility of providing a limiter in relation to the alternating input voltage of the control voltage generator.

What is claimed is:

1. A circuit arrangement for receiving an audio frequency signal applied to an input terminal thereof, and generating an output signal at an output terminal thereof, comprising:

a first signal path having an input coupled to said input terminal and an output coupled to said output terminal, said first signal path including a first amplifier having a first negative feedback path connected between its input and output, said first negative feedback path comprising a first variable resistor for varying the transmission characteristic of said first path and a first impedance means;

a second signal path having an input coupled to one of said input and output terminals, said second signal path including a second amplifier having a second negative feedback path connected between its input and output, said second negative feedback path comprising a second variable resistor for varying the transmission characteristic of said second path and a second impedance means;

a control voltage generator coupled to the output of said second signal path for generating a direct voltage corresponding to the alternating voltage at the output of said second signal path; and limiting means coupled between the output of said control voltage generator and said first and second variable resistors, said first and second variable resistors being varied in accordance with the output of said control voltage generator over a predetermined range determined by said first and second impedance means and said limiting means.

2. A circuit arrangement according to claim 1 wherein said limiting means is included within said control voltage generator.

3. A circuit arrangement according to claim 1 or 2 wherein said first and second impedance means are connected in series with said first and second variable resistors respectively.

4. A circuit arrangement according to claim 1 or 2 wherein said first and second impedance means are connected in parallel with said first and second variable resistors respectively.

5. A circuit arrangement according to claim 1 or 2 wherein said first impedance means comprises a first impedance connected in series with said first variable resistor and a second impedance connected in parallel with said first variable resistor, and wherein said second impedance means comprises a third impedance connected in series with said second variable resistor and a fourth impedance connected in parallel with said second variable resistor.

* * * * *

UNITED STATES PATENT AND TRADEMARK OFFICE
CERTIFICATE OF CORRECTION

PATENT NO. : 4,270,103
DATED : May 26, 1981
INVENTOR(S) : Ernst Schröder

It is certified that error appears in the above—identified patent and that said Letters Patent is hereby corrected as shown below:

In the heading of the patent, before [21], insert
--[73] Assignee:  Licentia Patent-Verwaltungs-G.m.b.H.
                  Frankfurt am Main, Federal Republic of Germany--

Column 3, line 55, change "$\frac{1}{2}$" to --1/2--.

Signed and Sealed this

Twenty-fifth Day of May 1982

[SEAL]

Attest:

Attesting Officer

GERALD J. MOSSINGHOFF
Commissioner of Patents and Trademarks